US011322819B2

(12) United States Patent
Onaka et al.

(10) Patent No.: US 11,322,819 B2
(45) Date of Patent: May 3, 2022

(54) ANTENNA MODULE

(71) Applicant: Murata Manufacturing Co., Ltd., Kyoto (JP)

(72) Inventors: Kengo Onaka, Kyoto (JP); Kuniaki Yosui, Kyoto (JP); Hirotsugu Mori, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 98 days.

(21) Appl. No.: 17/004,905

(22) Filed: Aug. 27, 2020

(65) Prior Publication Data

US 2020/0395650 A1 Dec. 17, 2020

Related U.S. Application Data

(63) Continuation of application No. PCT/JP2018/047566, filed on Dec. 25, 2018.

(30) Foreign Application Priority Data

Feb. 28, 2018 (JP) .............................. JP2018-035182

(51) Int. Cl.
  *H01Q 1/38* (2006.01)
  *H01Q 1/02* (2006.01)

(52) U.S. Cl.
  CPC ................. *H01Q 1/02* (2013.01); *H01Q 1/38* (2013.01)

(58) Field of Classification Search
  CPC ............ H01Q 1/02; H01Q 1/38; H01Q 1/243; H01Q 3/28; H01Q 3/36; H01Q 1/2283;
  (Continued)

(56) References Cited

U.S. PATENT DOCUMENTS

| 6,815,810 B2 | 11/2004 | Takehara et al. |
| 2015/0084180 A1* | 3/2015 | Seko ................... H01L 25/0655 257/713 |
| 2021/0036414 A1* | 2/2021 | Takayama ................ H01Q 1/48 |

FOREIGN PATENT DOCUMENTS

| JP | H04145705 A | 5/1992 |
| JP | 2014183058 A | 9/2014 |

(Continued)

OTHER PUBLICATIONS

International Search Report issued in Application No. PCT/JP2018/047566, dated Mar. 12, 2019.

(Continued)

*Primary Examiner* — David E Lotter
(74) *Attorney, Agent, or Firm* — Pearne & Gordon LLP

(57) ABSTRACT

An antenna module according to an embodiment of the present disclosure includes a dielectric substrate, a first antenna element, a first radio-frequency element, and a first heat-dissipating component. The first antenna element is provided on the dielectric substrate. The first radio-frequency element supplies electric power to the first antenna element. The first heat-dissipating component directs heat from the first radio-frequency element to the outside. The dielectric substrate, the first radio-frequency element, and the first heat-dissipating component are stacked in this order in the Z-axis direction, which is the direction normal to the dielectric substrate. The first heat-dissipating component includes metal. The first heat-dissipating component has a first width at its first position that differs from a second width at its second position located away from the first position in the Z-axis direction.

19 Claims, 15 Drawing Sheets

(58) Field of Classification Search
CPC ........ H01Q 21/065; H05K 7/20; H01L 23/29; H01L 2224/32225; H01L 2924/13055; H01L 2924/181
See application file for complete search history.

(56) References Cited

FOREIGN PATENT DOCUMENTS

| | | |
|---|---|---|
| JP | 2015211056 A | 11/2015 |
| JP | 2017224689 A | 12/2017 |
| WO | 2014020783 A1 | 2/2014 |

OTHER PUBLICATIONS

Written Opinion issued in Application No. PCT/JP2018/047566, dated Mar. 12, 2019.

* cited by examiner

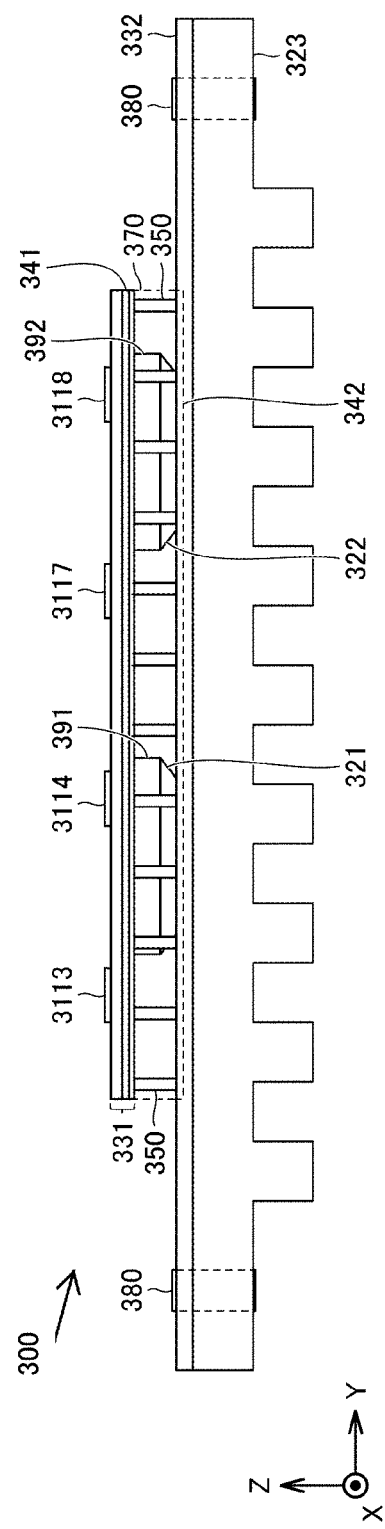

ANTENNA MODULE

This is a continuation of International Application No. PCT/JP2018/047566 filed on Dec. 25, 2018 which claims priority from Japanese Patent Application No. 2018-035182 filed on Feb. 28, 2018. The contents of these applications are incorporated herein by reference in their entireties.

BACKGROUND

Technical Field

The present disclosure relates to an antenna module.

Radio-frequency modules are known in the art that include a heat-dissipating component to direct heat from a radio-frequency element to the outside. For example, U.S. Pat. No. 6,815,810 (Patent Document 1) discloses a radio-frequency semiconductor device in which a semiconductor element (radio-frequency element) and a heat-dissipating electrode are connected by an interlayer connector via-hole (heat-dissipating component). The presence of the interlayer connector via-hole allows for effective dissipation of heat from the semiconductor element.

Patent Document 1: U.S. Pat. No. 6,815,810

BRIEF SUMMARY

A heat-dissipating component needs to direct heat from a radio-frequency element to the outside, and thus placed in proximity to or in contact with the radio-frequency element. In some cases, this can result in the heat-dissipating component being excited into resonance by the radio-frequency element, thus radiating electromagnetic waves to the outside.

In cases where an antenna module needs to radiate electromagnetic waves with a desired directivity from an antenna element, if electromagnetic waves are radiated from a heat-dissipating component in an unintended direction, this can cause the characteristics of the antenna module to deviate from desired characteristics.

The present disclosure reduces deviation of the characteristics of the antenna module from desired characteristics.

An antenna module according to an embodiment of the present disclosure includes a dielectric substrate, a first antenna element, a first radio-frequency element, and a first heat-dissipating component. The first antenna element is provided on the dielectric substrate. The first radio-frequency element supplies electric power to the first antenna element. The first heat-dissipating component directs heat from the first radio-frequency element to the outside. The dielectric substrate, the first radio-frequency element, and the first heat-dissipating component are stacked in this order in the direction of the normal to the dielectric substrate. The first heat-dissipating component includes metal. When viewed in cross-section in a first direction orthogonal to the direction of the normal, the first heat-dissipating component has a first width that differs from a second width, the first width being a width at a first position of the first heat-dissipating component, the second width being a width at a second position of the first heat-dissipating component, the second position being located away from the first position in the direction of the normal.

With an antenna module according to an embodiment of the present disclosure, when viewed in cross-section in a first direction orthogonal to the direction of the normal to the dielectric substrate, the first heat-dissipating component has a first width that differs from a second width, the first width being a width at a first position of the first heat-dissipating component, the second width being a width at a second position of the first heat-dissipating component, the second position being located away from the first position in the direction of the normal. This configuration makes it possible to reduce deviation of the characteristics of the antenna module from desired characteristics.

BRIEF DESCRIPTION OF THE SEVERAL VIEWS OF THE DRAWINGS

FIG. 27 is a plan view, as seen in the X-axis direction, of the antenna module illustrated in FIG. 25.

DETAILED DESCRIPTION

Figure 1:
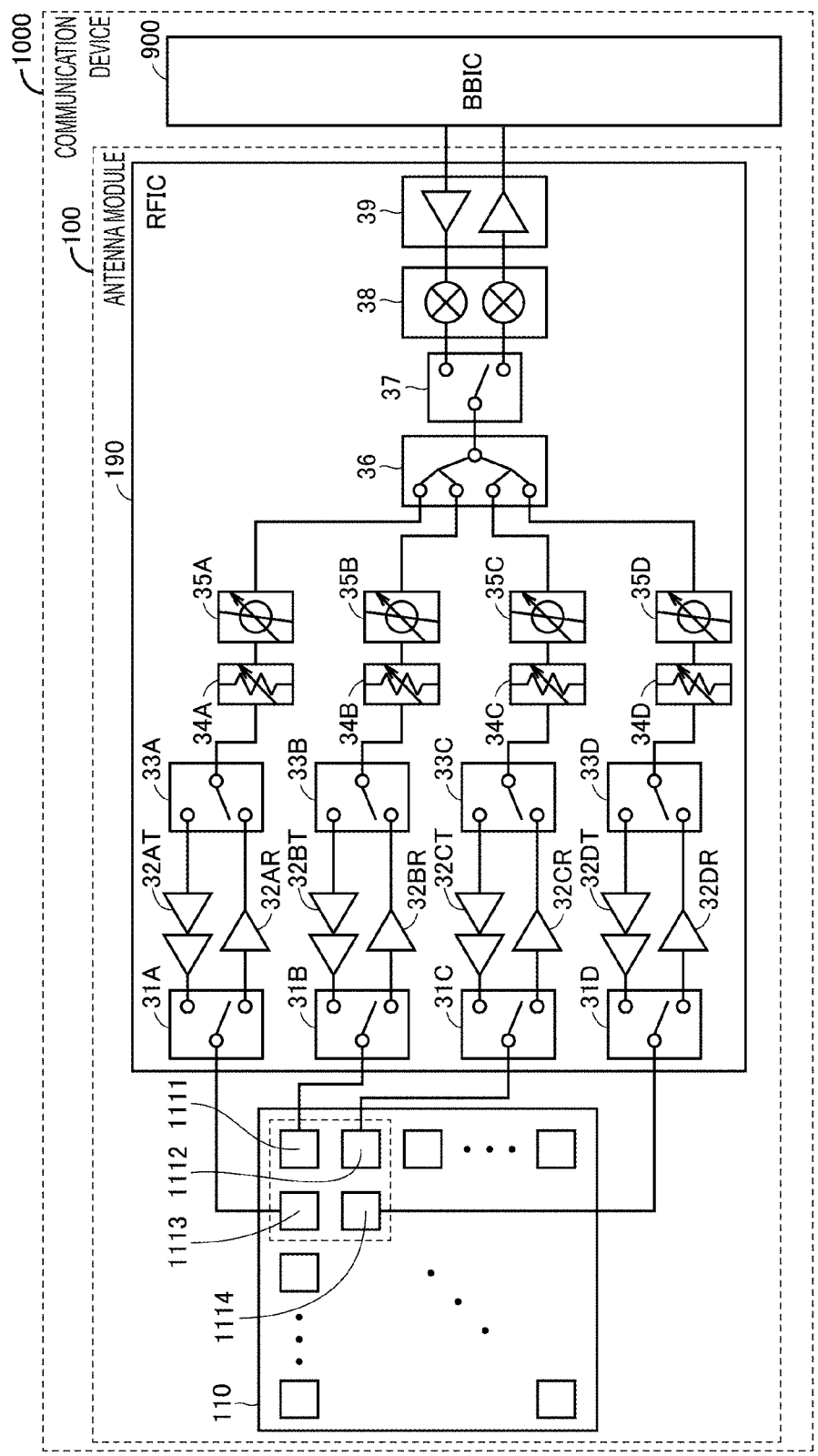
FIG. 1 is a block diagram of a communication device including an antenna array.

Embodiments of the disclosure will be described below in detail with reference to the drawings. In the drawings, identical or corresponding features will be designated by the same reference signs, and as a rule, their descriptions will not be repeated.

Embodiment 1

FIG. 1 is a block diagram of a communication device 1000 including an antenna array 110. Examples of the communication device 1000 include a mobile terminal, such as a mobile phone, a smartphone, or a tablet, and a personal computer with communication capability.

As illustrated in FIG. 1, the communication device 1000 includes an antenna module 100, and a baseband integrated circuit (BBIC) 900, which constitutes a baseband signal processing circuit. The antenna module 100 includes a radio-frequency integrated circuit (RFIC) 190, which is an example of a radio-frequency element, and the antenna array 110.

The communication device 1000 up-converts a signal transmitted from the BBIC 900 to the antenna module 100 into a radio-frequency signal, which is then radiated by the antenna array 110. The communication device 1000 down-converts a radio-frequency signal received at the antenna array 110 into a down-converted signal, which is then subjected to signal processing by the BBIC 900.

The antenna array 110 is a regular arrangement of plural flat antenna elements (radiation conductors). FIG. 1 depicts the RFIC 190 that corresponds to antenna elements 1111 to 1114 among the antenna elements constituting the antenna array 110.

Although the following description of Embodiment 1 is directed to a case where a single RFIC supplies electric power to four antenna elements, the number of antenna elements to receive supply of electric power from a single RFIC may be three or less, or five or more.

The RFIC 190 includes switches 31A to 31D, switches 33A to 33D, a switch 37, power amplifiers 32AT to 32DT, low-noise amplifiers 32AR to 32DR, attenuators 34A to 34D, phase shifters 35A to 35D, a signal combiner/splitter 36, a mixer 38, and an amplifier circuit 39.

The RFIC 190 is formed as, for example, a single integrated circuit chip including circuit elements (switches, power amplifiers, low-noise amplifiers, attenuators, and phase shifters) corresponding to the antenna elements included in the antenna array 110. Alternatively, these circuit elements may be formed as a single integrated circuit ship for each antenna element, separately from the RFIC 190.

In receiving a radio-frequency signal, the switches 31A to 31D and the switches 33A to 33D are respectively switched toward the low-noise amplifiers 32AR to 32DR, and the switch 37 is connected to the receiving-side amplifier of the amplifier circuit 39.

Radio-frequency signals received by the antenna elements 1111 to 1114 are respectively routed through the signal paths from the switches 31A to 31D to the phase shifters 35A to 35D, combined by the signal combiner/splitter 36, down-converted by the mixer 38, and then amplified by the amplifier circuit 39 before being transmitted to the BBIC 900.

In transmitting a radio-frequency signal from the antenna array 110, the switches 31A to 31D and the switches 33A to 33D are respectively switched toward the power amplifiers 32AT to 32DT, and the switch 37 is connected to the transmitting-side amplifier of the amplifier circuit 39.

A signal transmitted from the BBIC 900 is amplified by the amplifier circuit 39, and then up-converted by the mixer 38. The up-converted radio-frequency signal is split by the signal combiner/splitter 36 into four signals, which are each routed through the corresponding one of the signal paths from the phase shifters 35A to 35D to the switches 31A to 31D before being fed to the corresponding one of the antenna elements 1111 to 1114. The phase shifters 35A to 35D disposed in these signal paths are each individually adjusted in phase, thus allowing for adjustment of the directivity of the antenna array 110.

Figure 2:
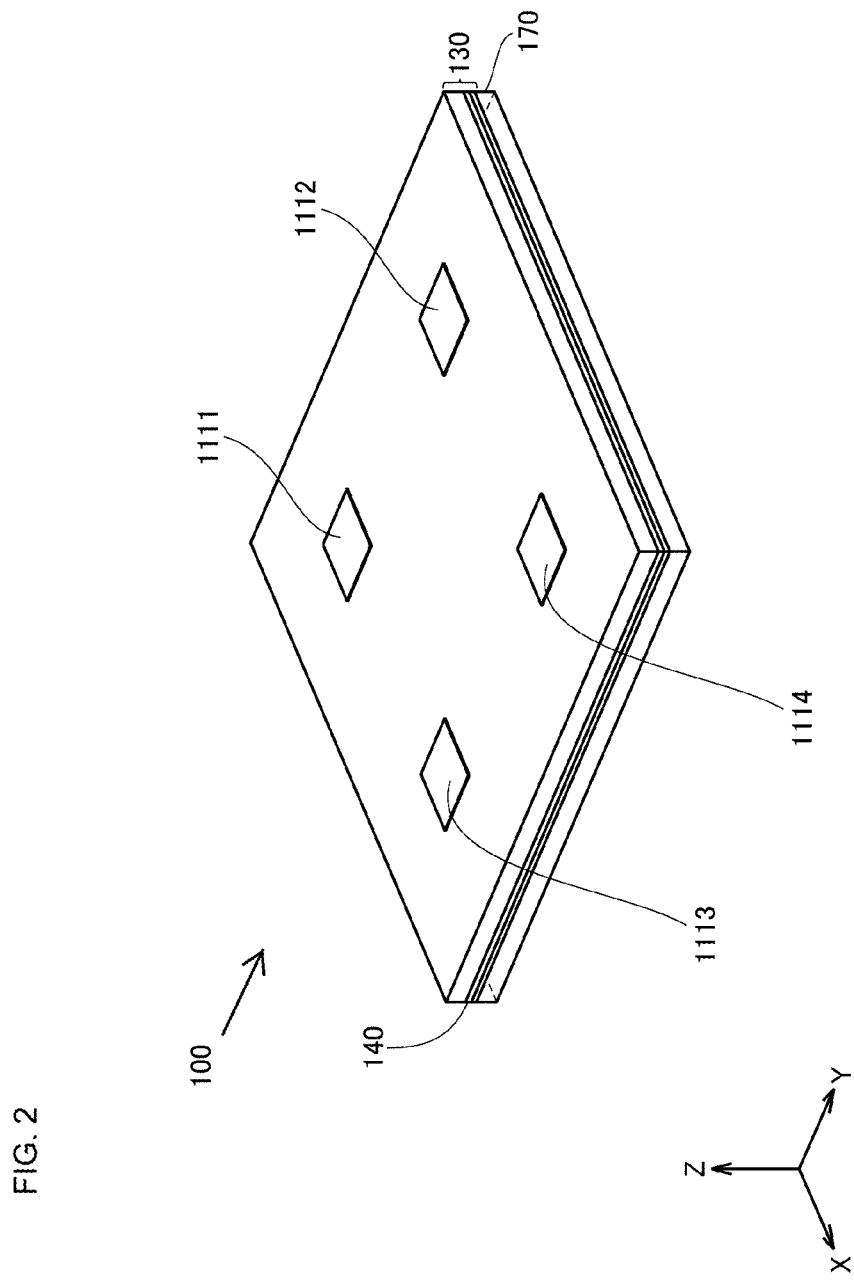
FIG. 2 is an exterior perspective view of an antenna module according to Embodiment 1.
Figure 3:
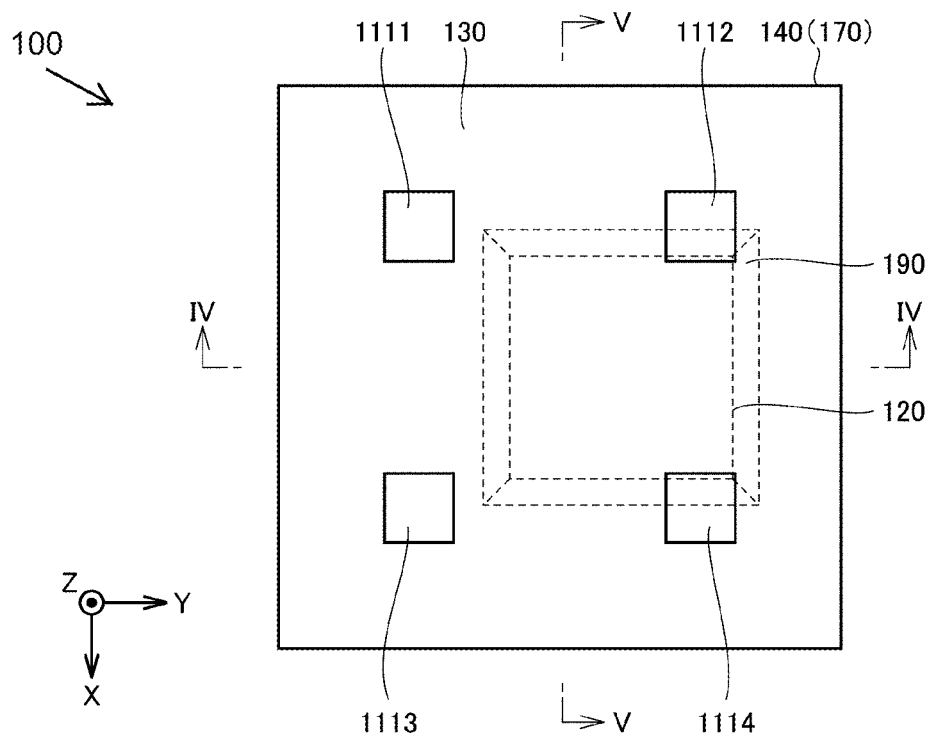
FIG. 3 is a plan view, as seen in the Z-axis direction, of the antenna module illustrated in FIG. 2.

FIG. 2 is an exterior perspective view of the antenna module 100 according to Embodiment 1. FIG. 3 is a plan view, as seen in the Z-axis direction, of the antenna module 100 illustrated in FIG. 2. With regard to the coordinate axes depicted in FIG. 2, the Z-axis is orthogonal to the X-axis (first direction), and the Y-axis (second direction) is orthogonal to the Z-axis and to the X-axis. The same also applies to FIGS. 3, 11, 13 to 15, and 17 to 27.

As illustrated in FIGS. 2 and 3, the antenna module 100 includes the antenna elements 1111 to 1114 (first antenna element), a heat-dissipating component 120 (first heat-dissipating component), a dielectric substrate 130, a ground electrode 140, a mold layer 170, and the RFIC 190 (first radio-frequency element).

For the dielectric substrate 130, the Z-axis direction corresponds to the direction normal to the dielectric substrate 130. The mold layer 170, and the dielectric substrate 130 are stacked in this order with the Z-axis direction being the direction of stacking.

The ground electrode 140 is disposed in the dielectric substrate 130 so as to face the antenna elements 1111 to 1114. The antenna module 100 is a microstrip antenna.

The antenna elements 1111 to 1114 are disposed in matrix on the dielectric substrate 130. Specifically, the antenna elements 1111 and 1112 are disposed along the Y-axis. The antenna elements 1113 and 1114 are disposed along the Y-axis. The antenna elements 1111 and 1113 are disposed along the X-axis. The antenna elements 1112 and 1114 are disposed along the X-axis.

The RFIC 190 is disposed in the mold layer 170 such that the RFIC 190 is positioned between the dielectric substrate 130 and the heat-dissipating component 120. The RFIC 190 is connected to each of the antenna elements 1111 to 1114 by a feed line (not illustrated) to supply electric power to each of the antenna elements 1111 to 1114.

When viewed in plan in the Z-axis direction, the heat-dissipating component 120 overlaps the entirety of the RFIC 190. The heat-dissipating component 120 directs heat from the RFIC 190 to the outside of the antenna module 100. The heat-dissipating component 120 includes metal.

The heat-dissipating component 120 needs to direct heat from the RFIC 190 to the outside. As such, the heat-dissipating component 120 is disposed in proximity to or in contact with the RFIC 190. In some cases, this can result in the heat-dissipating component 120 being excited into resonance by the RFIC 190, thus radiating electromagnetic waves to the outside. In other words, the heat-dissipating component 120 can potentially act as an antenna in a certain frequency band.

In cases where the antenna module 100 needs to radiate electromagnetic waves with a desired directivity from an antenna element, if electromagnetic waves are radiated from the heat-dissipating component 120 in an unintended direction, this can cause the characteristics of the antenna module 100 to deviate from desired characteristics.

To address this, with the antenna module 100, a lateral side of the heat-dissipating component 120 is inclined such that the heat-dissipating component 120 decreases in width with increasing distance from the RFIC 190. The presence of this inclination results in concentration of capacitance components at the edges of the heat-dissipating component 120. The concentration of electric field or current at the edges helps to narrow the frequency band in which the heat-dissipating component 120 can potentially act as an antenna. This results in reduced radiation of electromagnetic waves from the heat-dissipating component 120 to the outside, which helps to reduce deviation of the characteristics of the antenna module 100 from desired characteristics.

In cases where the heat-dissipating component 120 is fixed to the RFIC 190, if the heat-dissipating component 120 is made to decrease in width with increasing distance from the RFIC 190, a wider portion of the heat-dissipating component 120 is fixed to the RFIC 190 than if the heat-dissipating component 120 is made to increase in width with increasing distance from the RFIC 190. This allows for more secure fixing of the heat-dissipating component 120 to the RFIC 190, thus reducing unintended detachment of the heat-dissipating component 120 from the RFIC 190.

Figure 4:
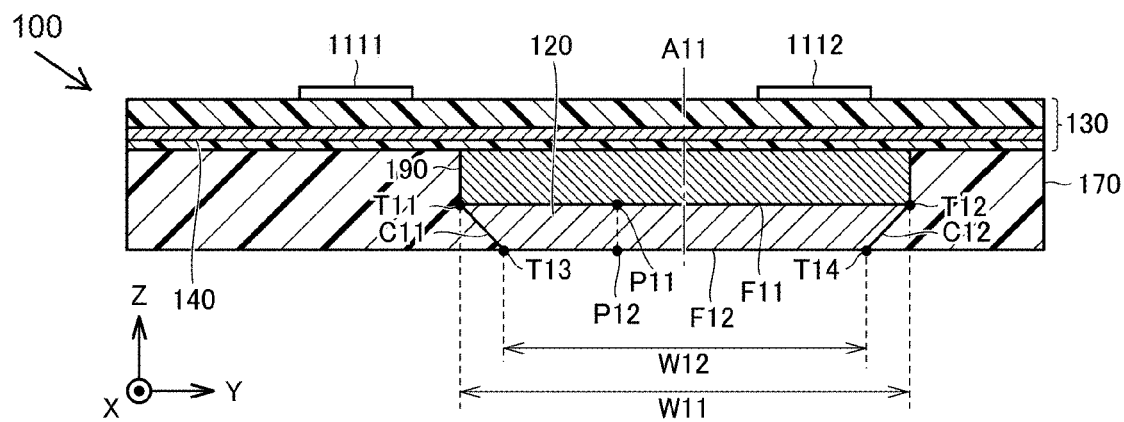
FIG. 4 is a cross-sectional view taken along a line IV-IV in FIG. 3.

FIG. 4 is a cross-sectional view taken along a line IV-IV in FIG. 3. As illustrated in FIG. 4, in cross-sectional view seen in the X-axis direction, the following holds with regard to the width of the heat-dissipating component 120 in the Y-axis direction (width direction): The width W11 (first width) of the heat-dissipating component 120 at its position P11 (first position) is greater than the width W12 (second width) of the heat-dissipating component 120 at its position P12 (second position), which is located away from the position P11 in the Z-axis direction.

The heat-dissipating component 120 has a surface F11 (first surface) and a surface F12 (second surface) that are orthogonal to the Z-axis direction. The heat-dissipating component 120 has a lateral side that connects the surfaces F11 and F12. The distance between the RFIC 190 and the surface F12 is greater than the distance between the RFIC 190 and the surface F11. The surface F11 includes the position P11. The surface F12 includes the position P12.

The heat-dissipating component 120 has, as its opposite ends in the Y-axis direction at the position P11, an end portion T11 (first end portion) and an end portion T12 (second end portion). The heat-dissipating component 120 has, as its opposite ends in the Y-axis direction at the position P12, an end portion T13 (third end portion) and an end portion T14 (fourth end portion). The end portion T13 is closer to the centerline A11 between the end portions T11 and T12 than the end portion T11 is. The end portion T14 is closer to the centerline A11 than the end portion T12 is.

The lateral side of the heat-dissipating component 120 has a contour C11 defined between the end portions T11 and T13. The lateral side of the heat-dissipating component 120 has a contour C12 defined between the end portions T12 and T14. The contours C11 and C12 are straight lines.

Figure 5:
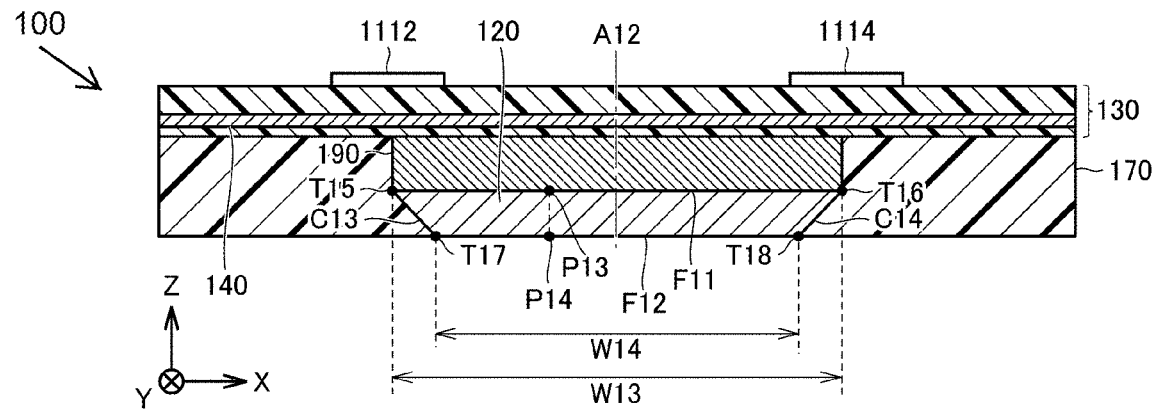
FIG. 5 is a cross-sectional view taken along a line V-V in FIG. 3.

FIG. 5 is a cross-sectional view taken along a line V-V in FIG. 3. As illustrated in FIG. 5, in cross-sectional view seen in the Y-axis direction, the following holds with regard to the width of the heat-dissipating component 120 in the X-axis direction: The width W13 (third width) of the heat-dissipating component 120 at its position P13 (third position) is greater than the width W14 (fourth width) of the heat-dissipating component 120 at its position P14 (fourth position), which is located away from the position P13 in the Z-axis direction.

The heat-dissipating component 120 has, as its opposite ends in the X-axis direction at the position P13, an end portion T15 and an end portion T16. The heat-dissipating component 120 has, as its opposite ends in the X-axis direction at the position P14, an end portion T17 and an end portion T18. The end portion T17 is closer to the centerline A12 between the end portions T15 and T16 than the end portion T15 is. The end portion T18 is closer to the centerline A12 than the end portion T16 is.

The lateral side of the heat-dissipating component 120 has a contour C13 defined between the end portions T15 and T17. The lateral side of the heat-dissipating component 120 has a contour C14 defined between the end portions T16 and T18. The contours C13 and C14 are straight lines.

With reference to FIGS. 6 to 16, the following describes a simulation in which power is intentionally fed from a radio-frequency element to a heat-dissipating component to make the heat-dissipating component act as an antenna. The simulation is carried out to show that, with regard to the frequency band in which a heat-dissipating component can potentially act as an antenna (the band with the return loss greater than or equal to 6 dB), such a frequency band is narrower for a heat-dissipating component whose lateral side has an inclination than for a heat-dissipating component whose lateral side has no inclination.

Figure 6:
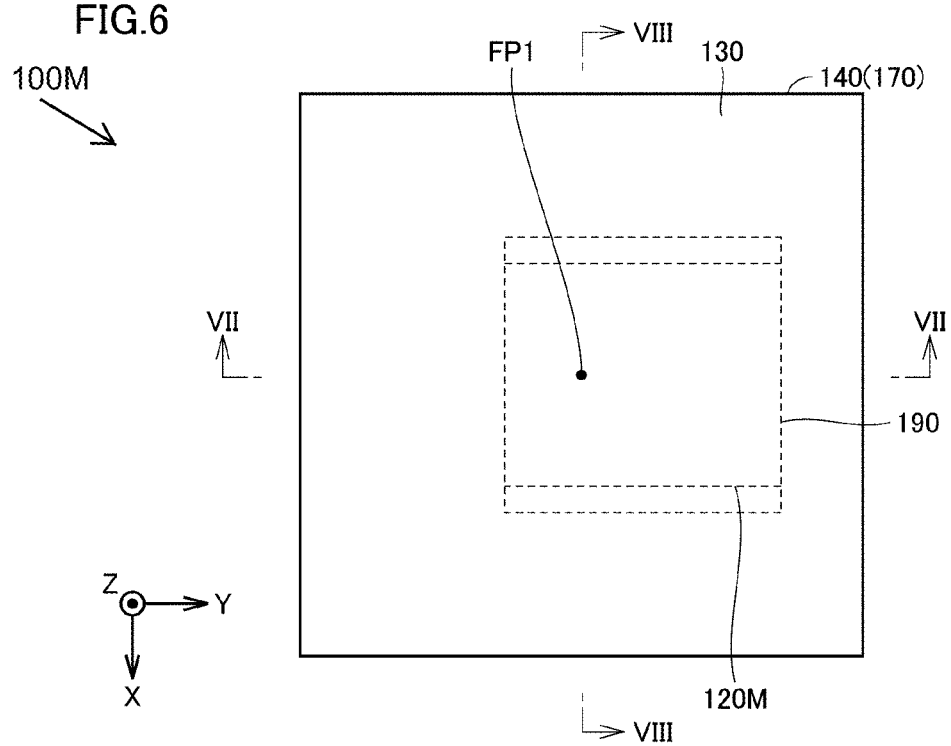
FIG. 6 is a plan view, as seen in the Z-axis direction, of an antenna module used for simulation.
Figure 7:
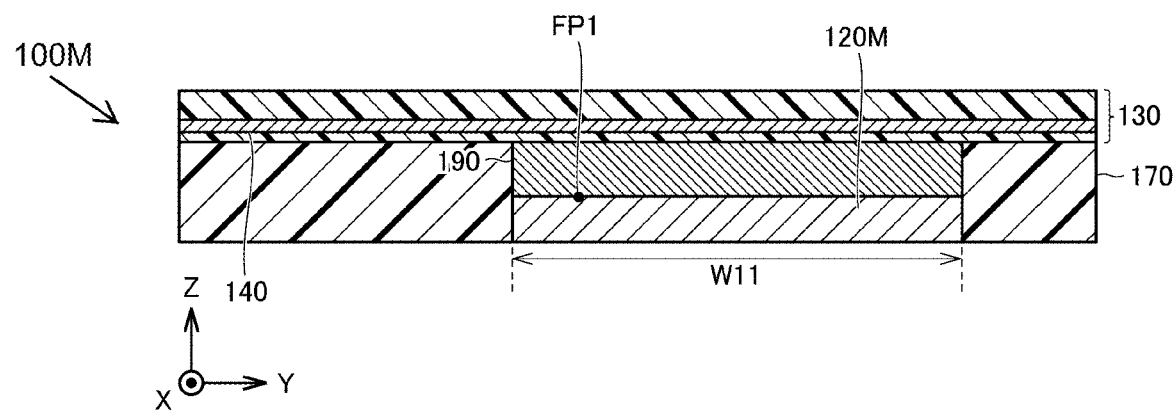
FIG. 7 is a cross-sectional view taken along a line VII-VII in FIG. 6.
Figure 8:
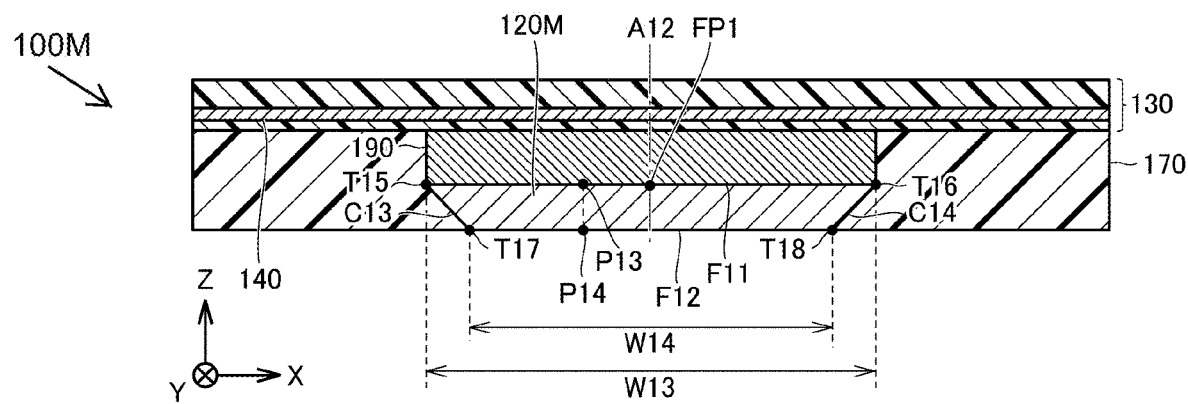
FIG. 8 is a cross-sectional view taken along a line VIII-VIII in FIG. 6.

FIG. 6 is a plan view, as seen in the Z-axis direction, of an antenna module 100M used for simulation. FIG. 7 is a cross-sectional view taken along a line VII-VII in FIG. 6. FIG. 8 is a cross-sectional view taken along a line VIII-VIII in FIG. 6. The antenna module 100M differs from the antenna module 100 illustrated in FIGS. 3 to 5 in that the antenna elements 1111 to 1114 are removed, and the heat-dissipating component 120 is replaced with a heat-dissipating component 120M. In the antenna module 100M, power is fed at a feeding point FP1 from the RFIC 190 to the heat-dissipating component 120M. The antenna module 100M is otherwise similar to the antenna module 100, and thus will not be described in repetitive detail.

As illustrated in FIGS. 6 and 7, the lateral side of the heat-dissipating component 120M extending in the X-axis direction has no inclination, and the width W11 of the heat-dissipating component 120M in the Y-axis direction is thus constant. By contrast, as illustrated in FIGS. 6 and 8, the lateral side of the heat-dissipating component 120M extending in the Y-axis direction has an inclination, such that the width of the heat-dissipating component 120M gradually decreases from W13 to W14 with increasing distance from the RFIC 190 in the Z-axis direction.

The antenna module 100M has an inclination provided in areas where the current distribution is concentrated. This inclination causes the current distribution to become localized, thus narrowing the frequency band in which the heat-dissipating component 120M can potentially act as an antenna. This results in reduced radiation of electromagnetic waves from the heat-dissipating component 120M.

Figure 9:
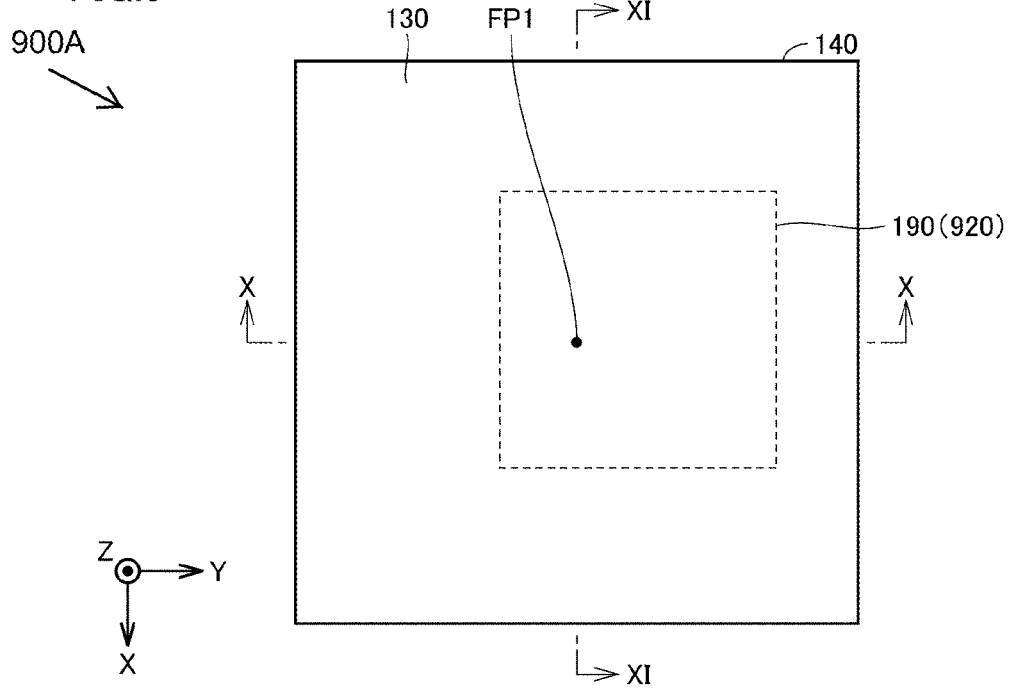
FIG. 9 is a plan view, as seen in the Z-axis direction, of an antenna module according to a comparative example used for simulation.
Figure 10:
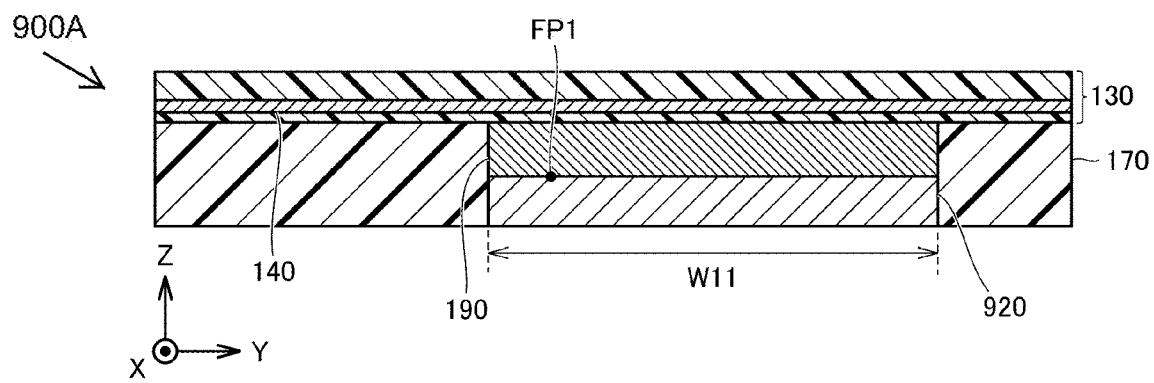
FIG. 10 is a cross-sectional view taken along a line X-X in FIG. 9.
Figure 11:
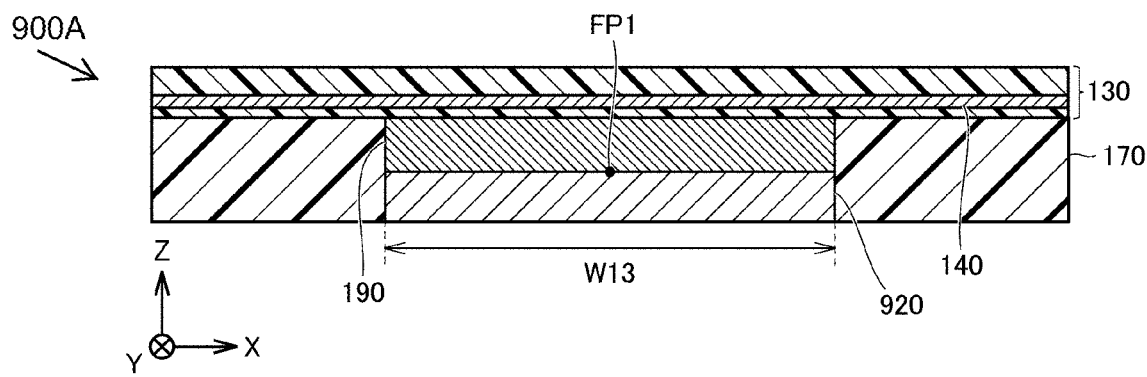
FIG. 11 is a cross-sectional view taken along a line XI-XI in FIG. 9.

FIG. 9 is a plan view, as seen in the Z-axis direction, of an antenna module 900A according to a comparative example used for simulation. FIG. 10 is a cross-sectional view taken along a line X-X in FIG. 9. FIG. 11 is a cross-sectional view taken along a line XI-XI in FIG. 9. The antenna module 900A differs from the antenna module 100M illustrated in FIGS. 6 to 8 in that the heat-dissipating component 120M is replaced with a heat-dissipating component 920. The antenna module 900A is otherwise similar in configuration to the antenna module 100M, and thus will not be described in repetitive detail.

As illustrated in FIGS. 9 and 10, the lateral side of the heat-dissipating component 920 extending in the X-axis direction has no inclination, and the width W11 of the heat-dissipating component 920 in the Y-axis direction is thus constant. Further, as illustrated in FIGS. 9 and 11, the lateral side of the heat-dissipating component 920 extending in the Y-axis direction also has no inclination, and the width W13 of the heat-dissipating component 920 in the X-axis direction is thus constant.

Figure 12:
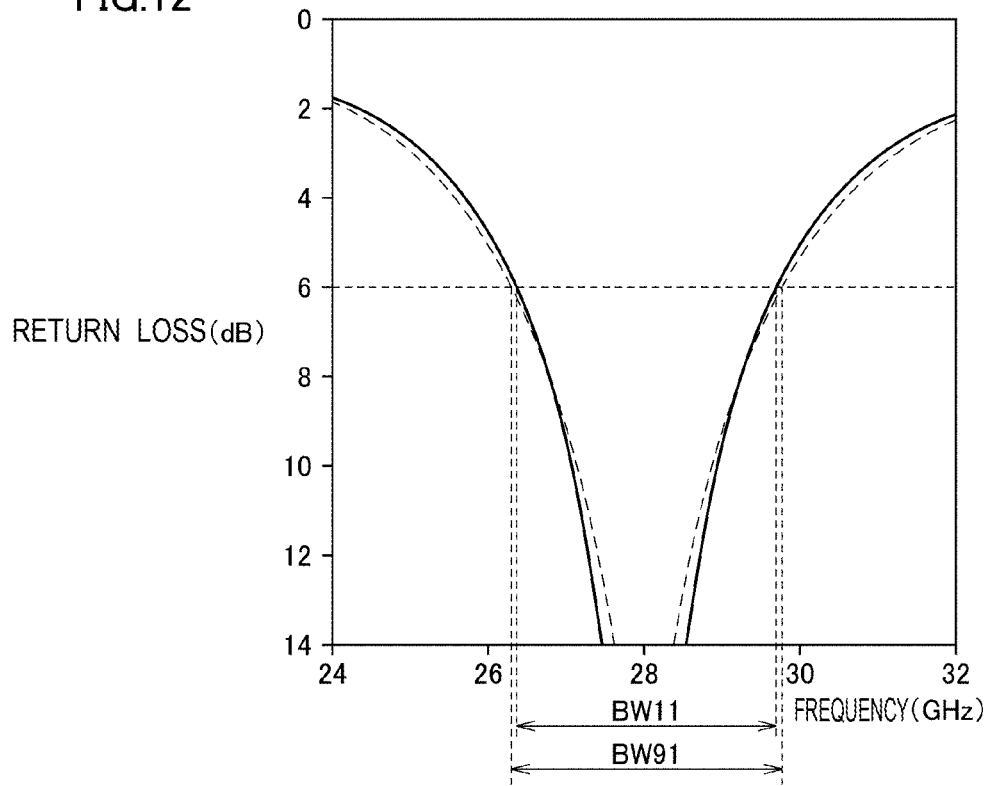
FIG. 12 illustrates both the return loss (solid lines) of the antenna module illustrated in FIG. 6, and the return loss (dotted lines) of the antenna module illustrated in FIG. 9.

FIG. 12 illustrates both the return loss (solid lines) of the antenna module 100M illustrated in FIG. 6, and the return loss (dotted lines) of the antenna module 900A illustrated in FIG. 9. As illustrated in FIG. 12, the band in which the antenna module 100M has a return loss of 6 dB or more is BW11 (26.428 GHz to 29.749 GHz). The band BW11 has a band width of 3.321 GHz. By contrast, the band in which the antenna module 900A has a return loss of 6 dB or more is BW91 (26.452 GHz to 29.779 GHz). The band BW91 has a band width of 3.327 GHz. The band width of the band BW11 is narrower than the band width of the band BW91 by 0.006 GHz.

Figure 13:
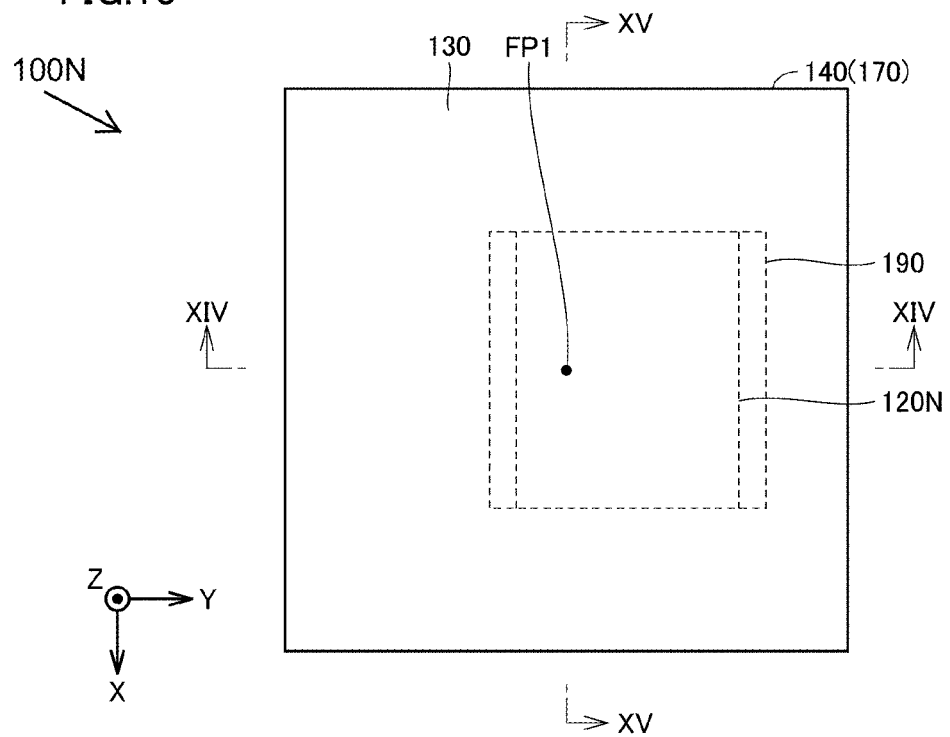
FIG. 13 is a plan view, as seen in the Z-axis direction, of another antenna module used for simulation.
Figure 14:
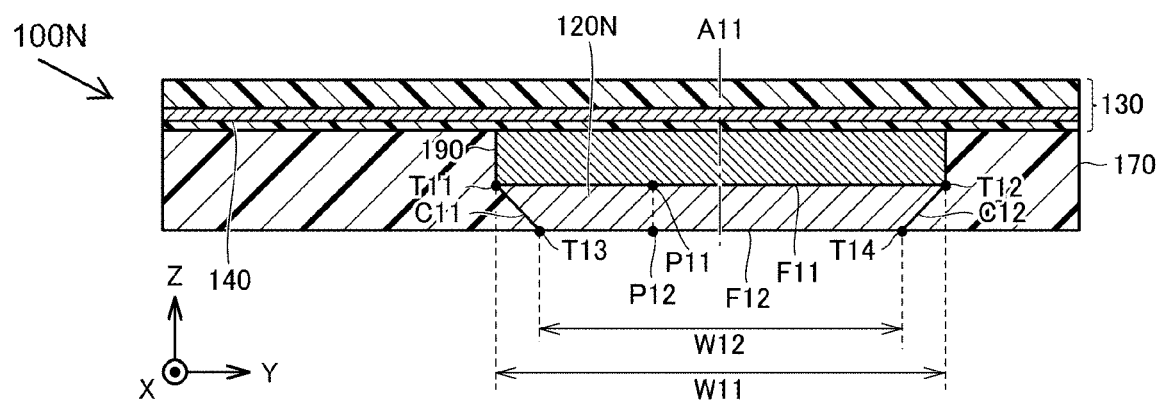
FIG. 14 is a cross-sectional view taken along a line XIV-XIV in FIG. 13.
Figure 15:
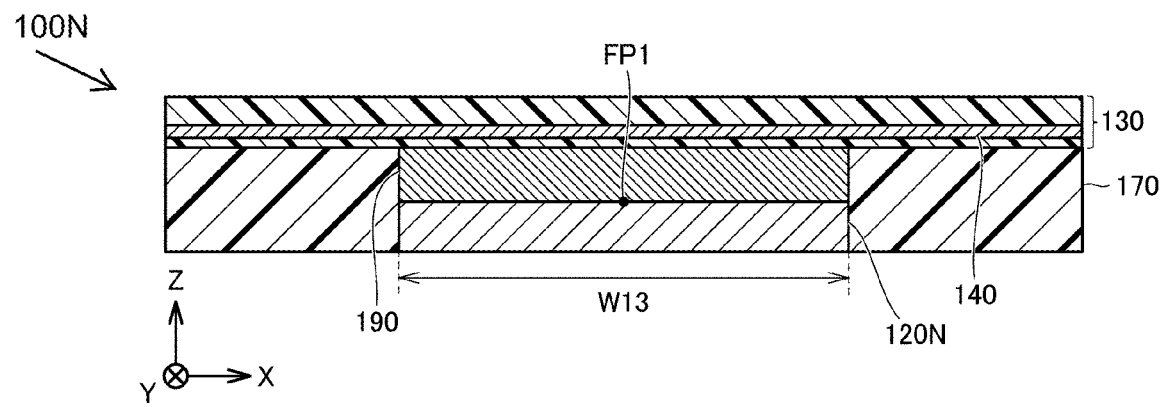
FIG. 15 is a cross-sectional view taken along a line XV-XV in FIG. 13.

FIG. 13 is a plan view, as seen in the Z-axis direction, of an antenna module 100N used for simulation. FIG. 14 is a cross-sectional view taken along a line XIV-XIV in FIG. 13. FIG. 15 is a cross-sectional view taken along a line XV-XV in FIG. 13. The antenna module 100N differs from the antenna module 100M illustrated in FIGS. 6 to 8 in that the heat-dissipating component 120M is replaced with a heat-dissipating component 120N. The antenna module 100N is otherwise similar to the antenna module 100M, and thus will not be described in repetitive detail.

As illustrated in FIGS. 13 and 14, the lateral side of the heat-dissipating component 120N extending in the X-axis direction has an inclination, such that the width of the heat-dissipating component 120N gradually decreases from W11 to W12 with increasing distance from the RFIC 190 in the Z-axis direction. By contrast, as illustrated in FIGS. 13 and 15, the lateral side of the heat-dissipating component 120N extending in the Y-axis direction has no inclination, and the width W13 of the heat-dissipating component 120N in the X-axis direction is thus constant.

The antenna module 100N has an inclination provided in areas where the current distribution is distributed. This inclination causes the electric field distribution to become localized, thus narrowing the frequency band in which the heat-dissipating component 120N can potentially act as an antenna. This results in reduced radiation of electromagnetic waves from the heat-dissipating component 120N.

Figure 16:
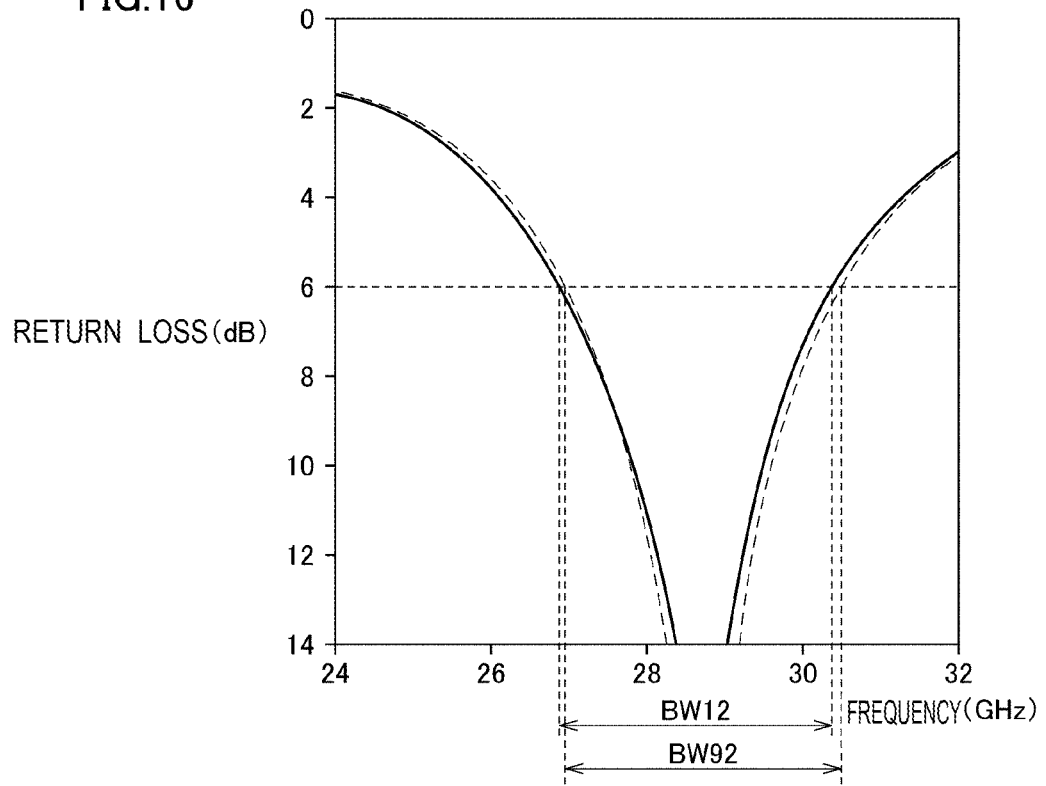
FIG. 16 illustrates both the return loss (solid lines) of the antenna module illustrated in FIG. 13, and the return loss (dotted lines) of the antenna module illustrated in FIG. 9.

FIG. 16 illustrates both the return loss (solid lines) of the antenna module 100N illustrated in FIG. 13, and the return loss (dotted lines) of the antenna module 900A illustrated in FIG. 9. As illustrated in FIG. 16, the band in which the antenna module 100N has a return loss of 6 dB or more is BW12 (26.950 GHz to 30.447 GHz). The band BW12 has a band width of 3.497 GHz. By contrast, the band in which the antenna module 900A has a return loss of 6 dB or more is BW92 (27.004 GHz to 30.509 GHz). The band BW92 has a band width of 3.505 GHz. The band width of the band BW12 is narrower than the band width of the band BW92 by 0.008 GHz.

Modifications 1 and 2 of Embodiment 1

The foregoing description of Embodiment 1 is directed to the case where the lateral side of the heat-dissipating component has an inclination, and when viewed in cross-section in the first direction, the lateral side has a contour that is a straight line.

The following description of Modifications 1 and 2 of Embodiment 1 is directed to a case where the above-mentioned contour is a curved line.

Figure 17:
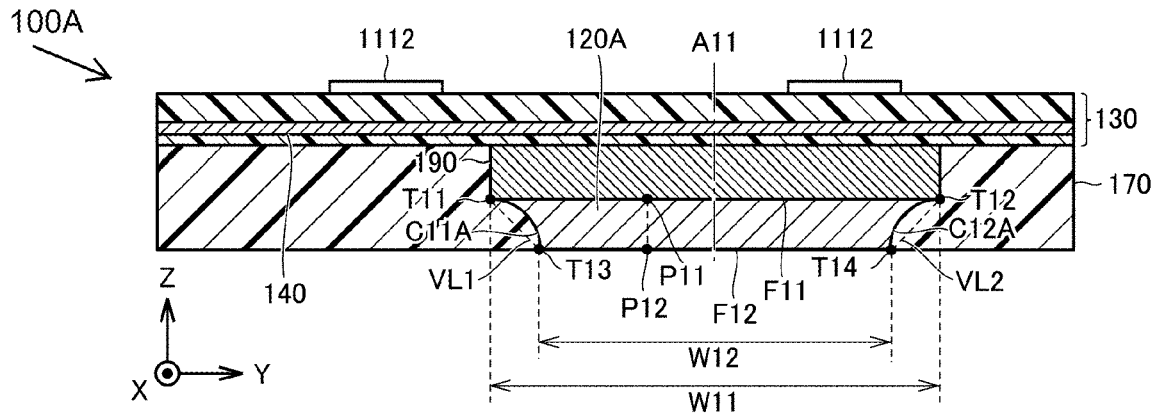
FIG. 17 is a cross-sectional view of an antenna module according to Modification 1 of Embodiment 1.

FIG. 17 is a cross-sectional view of an antenna module 100A according to Modification 1 of Embodiment 1. The antenna module 100A differs from the antenna module 100 illustrated in FIG. 4 in that the heat-dissipating component 120, and the contours C11 and C12 are respectively replaced with a heat-dissipating component 120A, and contours C11A and C12A. The antenna module 100A is otherwise similar in configuration to the antenna module 100, and thus will not be described in repetitive detail.

As illustrated in FIG. 17, the contour C11A is bent in a direction toward the RFIC 190 when viewed from a virtual line VL1 (first virtual line) that passes the end portions T11 and T13. The contour C12A is bent in a direction toward the RFIC 190 when viewed from a virtual line VL2 (second virtual line) that passes the end portions T12 and T14.

Figure 18:
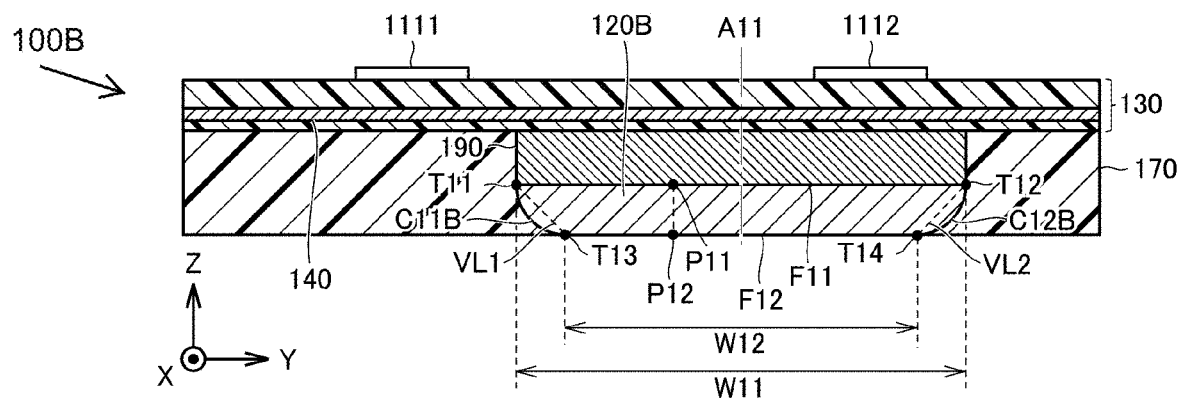
FIG. 18 is a cross-sectional view of an antenna module according to Modification 2 of Embodiment 1.

FIG. 18 is a cross-sectional view of an antenna module 100B according to Modification 2 of Embodiment 1. The antenna module 100B differs from the antenna module 100 illustrated in FIG. 4 in that the heat-dissipating component 120, and the contours C11 and C12 are respectively replaced with a heat-dissipating component 120B, and contours C11B and C12B. The antenna module 100B is otherwise similar in configuration to the antenna module 100, and thus will not be described in repetitive detail.

As illustrated in FIG. 18, the contour C11B is bent in a direction away from the RFIC 190 when viewed from the virtual line VL1 that passes the end portions T11 and T13. The contour C12B is bent in a direction away from the RFIC 190 when viewed from the virtual line VL2 that passes the end portions T12 and T14.

Modification 3 of Embodiment 1

The foregoing description of Embodiment 1, and Modifications 1 and 2 of Embodiment 1 is directed to the case where the first surface of the heat-dissipating component includes the first position, and the heat-dissipating component gradually decreases in width from the first surface of the heat-dissipating component to the second surface. The following description of Modification 3 of Embodiment 1 is directed to a case where the first surface does not include the first position, and the width of the heat-dissipating component is constant from the first surface to the first position, and gradually decreases from the first position to the second surface.

Figure 19:
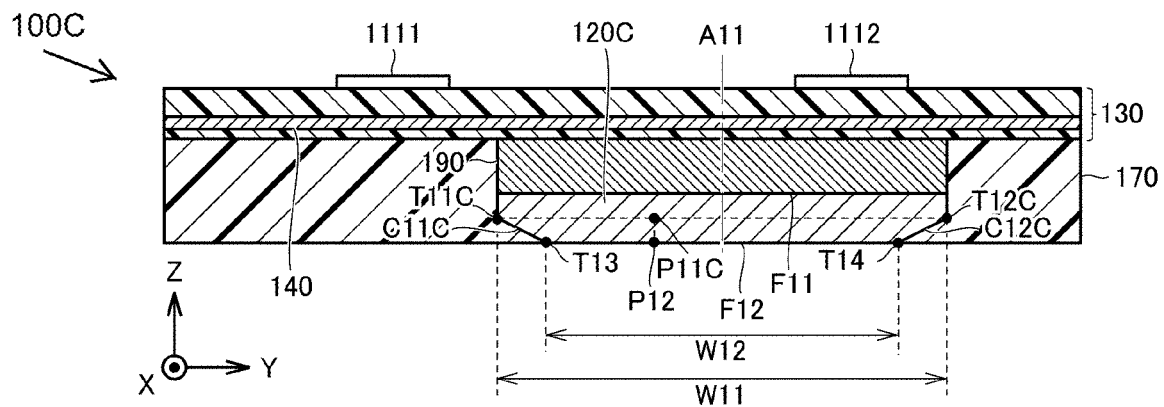
FIG. 19 is a cross-sectional view of an antenna module according to Modification 3 of Embodiment 1.

FIG. 19 is a cross-sectional view of an antenna module 100C according to Modification 3 of Embodiment 1. The antenna module 100C differs from the antenna module 100 illustrated in FIG. 4 in that the heat-dissipating component 120, the position P11, the end portions T11 and T12, and the contours C11 and C12 are respectively replaced with a heat-dissipating component 120C, a position P11C, end portions T11C and T12C, and contours C11C and C12C. The antenna module 100C is otherwise similar in configuration to the antenna module 100, and thus will not be described in repetitive detail.

As illustrated in FIG. 19, the surface F11 does not include the position P11C. The width of the heat-dissipating component 120C is constant between the surface F11 and the position P11C. The width of the heat-dissipating component 120C gradually decreases from the position P11C to the surface F12.

Modifications 4 to 6 of Embodiment 1

The foregoing description of Embodiment 1, and Modifications 1 to 3 of Embodiment 1 is directed to the case where the heat-dissipating component gradually decreases in width from the first position to the second position. However, the heat-dissipating component may not necessarily have a shape such that its width gradually decreases from the first position to the second position. The heat-dissipating component may have any shape as long as the first width at its first position differs from the second width at its second position.

Figure 20:
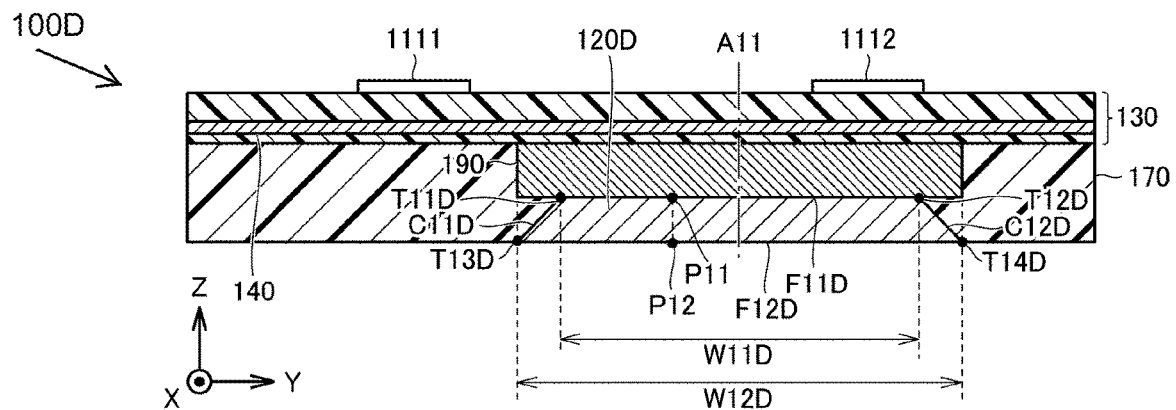
FIG. 20 is a cross-sectional view of an antenna module according to Modification 4 of Embodiment 1.

For instance, the heat-dissipating component may gradually increase in width from the first position to the second position. FIG. 20 is a cross-sectional view of an antenna module 100D according to Modification 4 of Embodiment 1. The antenna module 100D differs from the antenna module 100 illustrated in FIG. 4 in that the heat-dissipating component 120, the end portions T11 to T14, the surfaces F11 and F12, and the contours C11 and C12 are respectively replaced with a heat-dissipating component 120D, end portions T11D to T14D, surfaces F11D and F12D, and contours C11D and C12D. The antenna module 100D is otherwise similar in configuration to the antenna module 100, and thus will not be described in repetitive detail.

As illustrated in FIG. 20, the surface F11D includes the position P11. The surface F12D includes the position P12. The heat-dissipating component 120D gradually increases in width from the position P11 to the position P12. As a result, the surface F12D of the heat-dissipating component 120D, which is exposed to the outside of the antenna module 100D, can be increased in width. This results in reduced thermal resistance of the heat-dissipating component 120D, thus allowing heat from the RFIC 190 to be readily released from the surface F12D of the heat-dissipating component 120D to the outside of the antenna module 100D.

Figure 21:
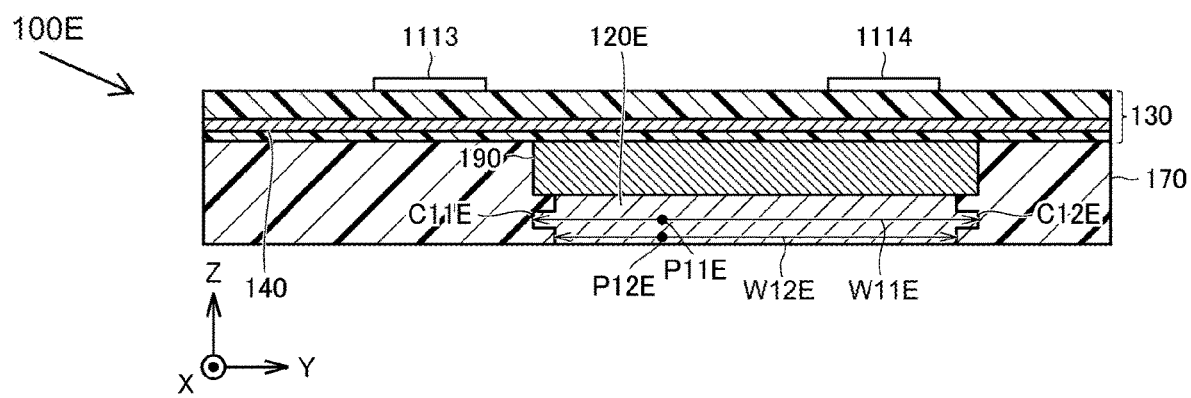
FIG. 21 is a cross-sectional view of an antenna module according to Modification 5 of Embodiment 1.

The heat-dissipating component may not necessarily change gradually in width from the first position to the second position. For instance, as with an antenna module 100E according to Modification 5 of Embodiment 1 illustrated in FIG. 21, in cross-sectional view, the contours C11E and C12E of the lateral side of a heat-dissipating component 120E may have a shape including a projecting portion. As illustrated in FIG. 21, the heat-dissipating component 120E has a width W11E greater than a width W12E, the width W11E being the width of the heat-dissipating component 120E at a position P11E which corresponds to the width of the projecting portion, the width W12E being the width of the heat-dissipating component 120E at a position P12E which corresponds to the width of a portion of the heat-dissipating component 120E other than the projecting portion.

Figure 22:
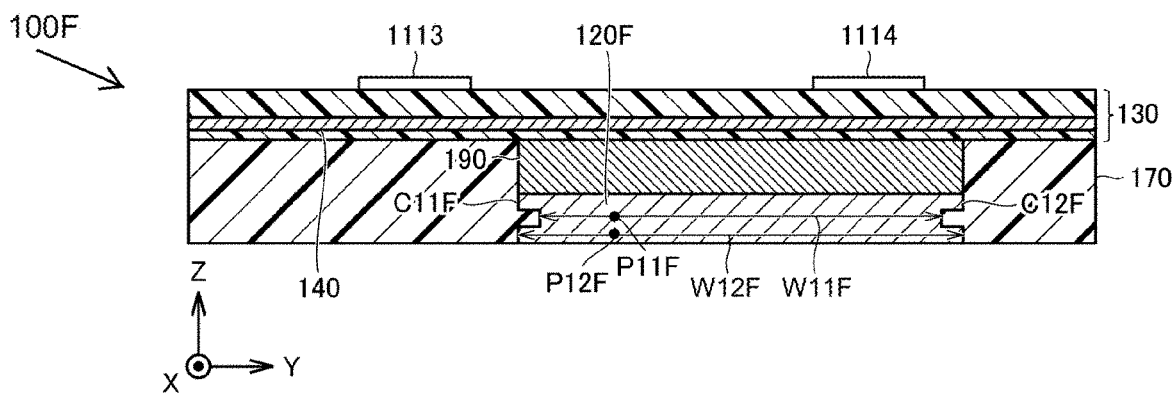
FIG. 22 is a cross-sectional view of an antenna module according to Modification 6 of Embodiment 1.

Alternatively, as with an antenna module 100F according to Modification 6 of Embodiment 1 illustrated in FIG. 22, in plan view in the X-axis direction, the contours C11F and C12F of the lateral side of a heat-dissipating component 120F may have a shape including a recessed portion. As illustrated in FIG. 22, the heat-dissipating component 120F has a width W11F less than a width W12F, the width W11F being the width of the heat-dissipating component 120F at a position P11F which corresponds to the width of the recessed portion, the width W12F being the width of the heat-dissipating component 120F at a position P12F which corresponds to the width of a portion of the heat-dissipating component 120F other than the recessed portion.

The above-mentioned configuration of the antenna module according to each of Embodiment 1 and Modifications 1 to 6 of Embodiment 1 helps to reduce deviation of the characteristics of the antenna module from desired characteristics.

Embodiment 2

The following description of Embodiment 2 is directed to improving heat dissipation by use of a heat-dissipating electrode of a radio-frequency element.

Figure 23:
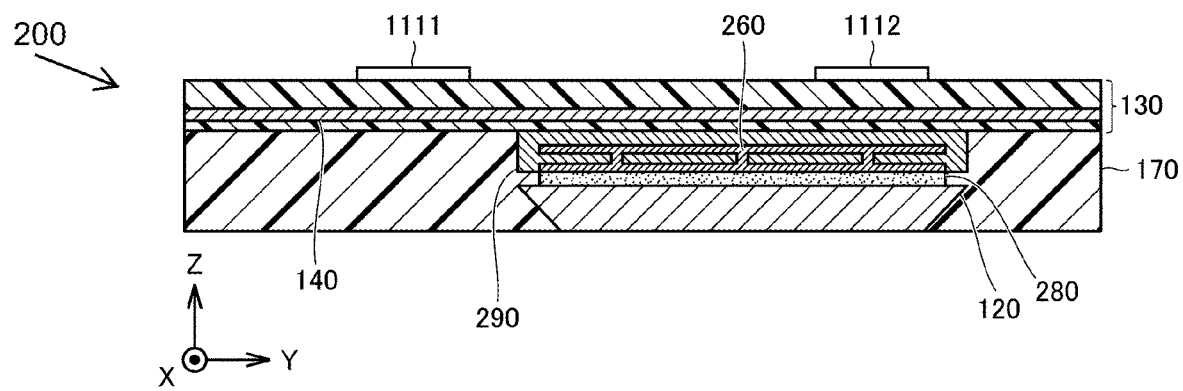
FIG. 23 is a cross-sectional view of an antenna module according to Embodiment 2.
Figure 24:
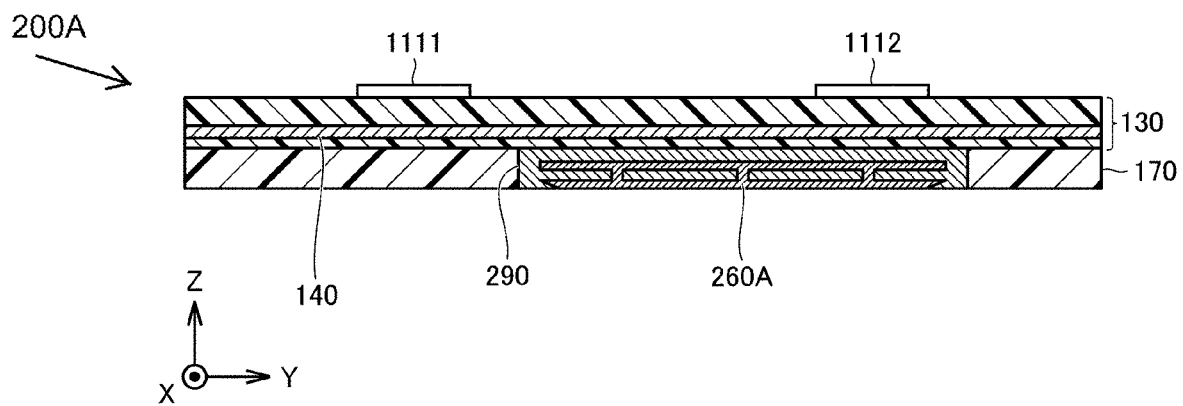
FIG. 24 is a cross-sectional view of an antenna module according to a modification of Embodiment 2.

FIG. 23 is a cross-sectional view of an antenna module 200 according to Embodiment 2. The antenna module 200 differs from the antenna module 100 illustrated in FIG. 4 in that the RFIC 190 is replaced with a RFIC 290, and a heat-dissipating electrode 260 and a bonding layer 280 are additionally provided. The antenna module 200 is otherwise similar in configuration to the antenna module 100, and thus will not be described in repetitive detail.

As illustrated in FIG. 23, the RFIC 290 includes the heat-dissipating electrode 260. The heat-dissipating electrode 260 is formed inside the RFIC 290 at the time of manufacture of the RFIC 290. A portion of the heat-dissipating electrode 260 is exposed through a grinding process to the surface of the RFIC 290. The heat-dissipating component 120 is fixed to the heat-dissipating electrode 260 with the bonding layer 280 interposed therebetween.

With the antenna module 200, heat from the RFIC 290 is transmitted to the heat-dissipating component 120 mainly through the heat-dissipating electrode 260. This allows for efficient dissipation of heat from the RFIC 290.

Modification of Embodiment 2

The foregoing description of Embodiment 2 is directed to the case where heat from the radio-frequency element is transmitted through the heat-dissipating electrode to the heat-dissipating component before being released to the outside. Alternatively, heat from the radio-frequency element may be directedly released to the outside from the heat-dissipating electrode. In such a case, as with an antenna module 200A according to a modification of Embodiment 2 illustrated in FIG. 24, a portion of a heat-dissipating electrode 260A exposed to the outside includes an inclination provided on its lateral side to thereby reduce radiation of electromagnetic waves from the heat-dissipating electrode 260A.

The above-mentioned configuration of the antenna module according to each of Embodiment 2 and the modification of Embodiment 2 helps to reduce deviation of the characteristics of the antenna module from desired characteristics, and also allows for efficient dissipation of heat from the radio-frequency element.

Embodiment 3

The foregoing description of Embodiments 1 and 2 is directed to an antenna module including a single radio-frequency element. In Embodiment 3, an antenna module with plural radio-frequency elements will be described.

Figure 25:
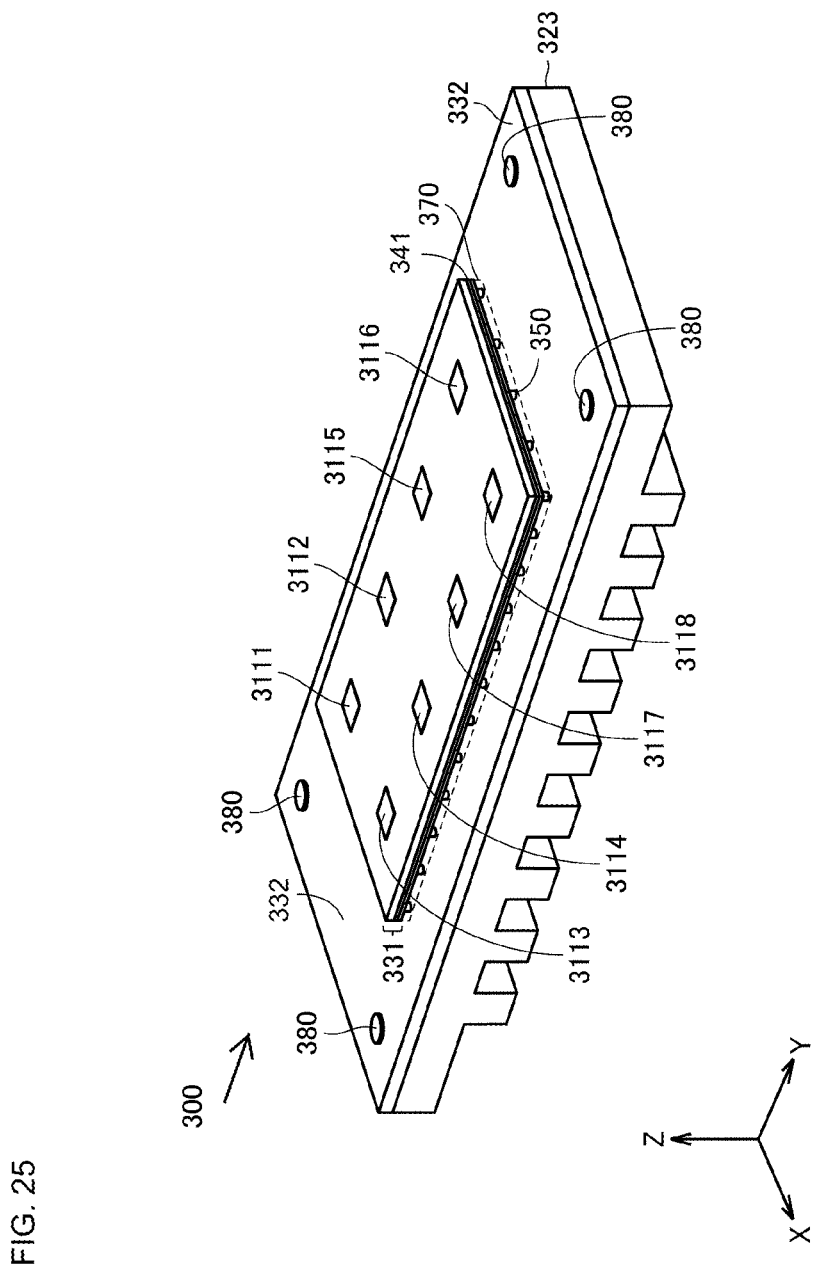
FIG. 25 is an exterior perspective view of an antenna module according to Embodiment 3.
Figure 26:
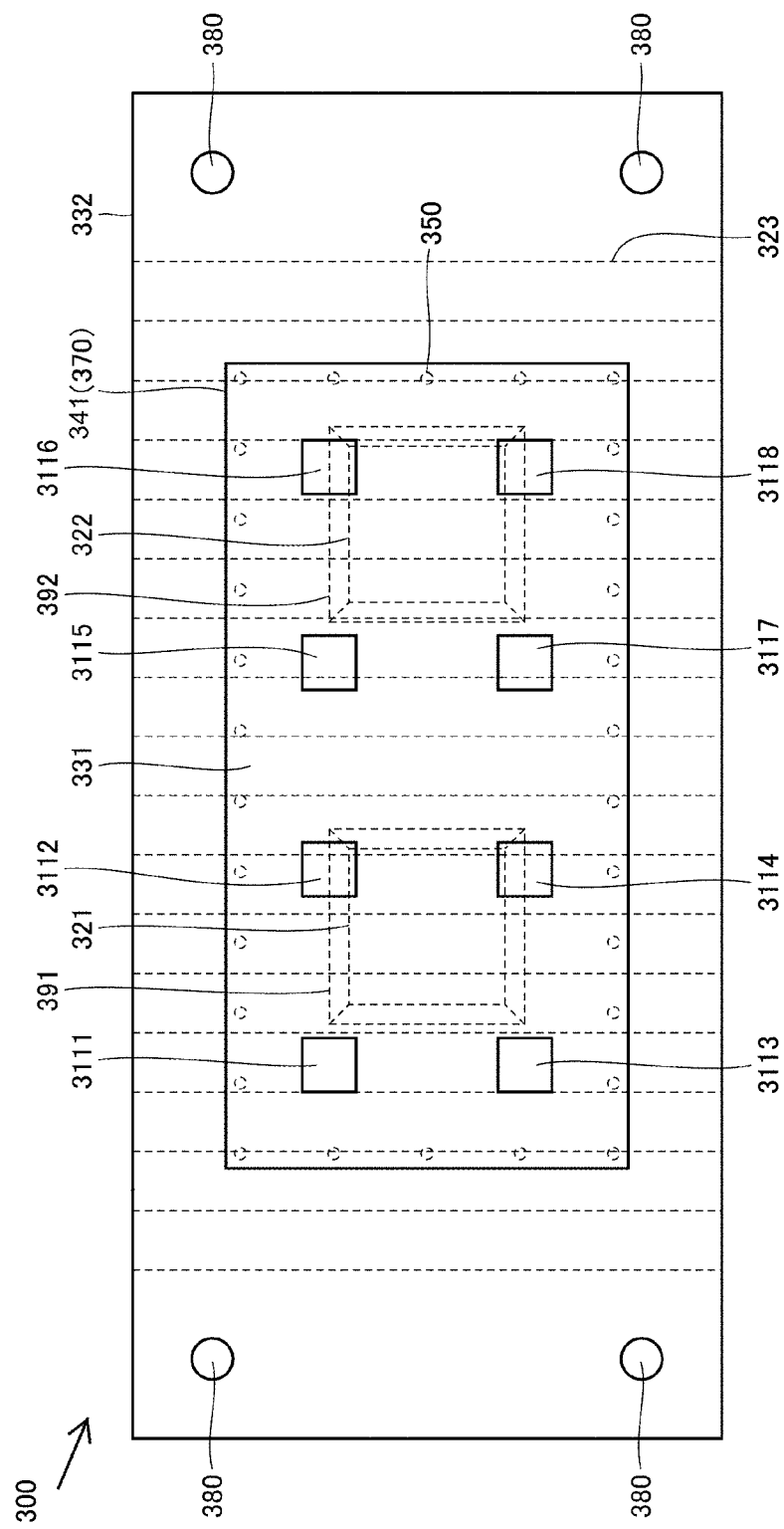
FIG. 26 is a plan view, as seen in the Z-axis direction, of the antenna module illustrated in FIG. 25.

FIG. 25 is an exterior perspective view of an antenna module 300 according to Embodiment 3. FIG. 26 is a plan view, as seen in the Z-axis direction, of the antenna module 300 illustrated in FIG. 25. FIG. 27 is a plan view, as seen in the X-axis direction, of the antenna module 300 illustrated in FIG. 25.

As illustrated in FIGS. 25 to 27, the antenna module 300 includes antenna elements 3111 to 3114 (first antenna element), antenna elements 3115 to 3118 (second antenna element), a heat-dissipating component 321 (first heat-dissipating component), a heat-dissipating component 322 (second heat-dissipating component), a heat sink 323 (third heat-dissipating component), a dielectric substrate 331 (dielectric substrate), a dielectric substrate 332, which represents a mother circuit board, a ground electrode 341, a ground electrode 342, plural via conductors 350, a mold layer 370, plural fixing components 380, a RFIC 391 (first radio-frequency element), and a RFIC 392 (second radio-frequency element).

The heat sink 323, the dielectric substrate 332, the mold layer 370, and the dielectric substrate 331 are stacked in this order with the Z-axis direction being the stacking direction. In FIGS. 25 and 27, the mold layer 370 is indicated by dotted lines to make the via conductors 350 easily visible.

The ground electrode 341 is disposed in the dielectric substrate 331 so as to face the antenna element 3111 to 3118. The antenna module 300 is a microstrip antenna.

The ground electrode 342 is disposed in the dielectric substrate 332. The ground electrode 342 is connected to the ground electrode 341 by the via conductors 350.

The antenna elements 3111 to 3118 are disposed in matrix on the dielectric substrate 331. Specifically, the antenna elements 3111, 3112, 3115, and 3116 are disposed along the Y-axis. The antenna elements 3113, 3114, 3117, and 3118 are disposed along the Y-axis. The antenna elements 3111 and 3113 are disposed along the X-axis. The antenna elements 3112 and 3114 are disposed along the X-axis. The antenna elements 3115 and 3117 are disposed along the X-axis. The antenna elements 3116 and 3118 are disposed along the X-axis.

The RFIC 391 is disposed in the mold layer 370 such that the RFIC 391 is positioned between the ground electrodes 341 and 342. The RFIC 391 is connected to each of the antenna elements 3111 to 3114 by a feed line (not illustrated) to supply electric power to each of the antenna elements 3111 to 3114.

The RFIC 392 is disposed in the mold layer 370 such that the RFIC 392 is positioned between the ground electrodes 341 and 342. The RFIC 392 is connected to each of the antenna elements 3115 to 3118 by a feed line (not illustrated) to supply electric power to each of the antenna elements 3115 to 3118.

The via conductors 350 are disposed so as to surround the RFICs 391 and 392. The via conductors 350 act as a shield to prevent noise from each of the RFICs 391 and 392 from being radiated to the outside. In FIG. 26, the via conductors 350 are disposed so as to surround the two RFICs 391 and 392 together as a whole, the via conductors 350 may not necessarily be disposed as illustrated in FIG. 26. Alternatively, for example, the via conductors 350 may be disposed so as to surround each one of the two RFICs 391 and 392 individually.

The heat-dissipating component 321 is disposed between the RFIC 391 and the ground electrode 342. When viewed in plan in the Z-axis direction, the heat-dissipating component 321 overlaps the entirety of the RFIC 391. The heat-dissipating component 321 directs heat from the RFIC 391 to the outside of the antenna module 300. The heat-dissipating component 321 includes metal.

The heat-dissipating component 322 is disposed between the RFIC 392 and the ground electrode 342. When viewed in plan in the Z-axis direction, the heat-dissipating component 322 overlaps the entirety of the RFIC 392. The heat-dissipating component 322 directs heat from the RFIC 392 to the outside of the antenna module 300. The heat-dissipating component 322 includes metal.

The heat-dissipating components 321 and 322 are identical in shape to the heat-dissipating component 120 illustrated in FIGS. 3 to 5, and thus will not be described in repetitive detail. The heat-dissipating components 321 and 322 may have the shape of one of the heat-dissipating components 120A to 120F illustrated in FIGS. 17 to 22. By making the heat-dissipating components 321 and 322 have a non-constant width, capacitive coupling between the heat-dissipating components 321 and 322 can be reduced in comparison to a case where the heat-dissipating components 321 and 322 have a constant width.

The heat sink 323 is fixed to the dielectric substrate 332 by use of the fixing components 380. When viewed in plan in the Z-axis direction, the heat sink 323 overlaps the entirety of the heat-dissipating component 321 and the entirety of the heat-dissipating component 322. The heat sink 323 is a heat-dissipating component common to the heat-dissipating components 321 and 322. The heat sink 323 directs heat from each of the heat-dissipating components 321 and 322 to the outside of the antenna module 300. The heat sink 323 may not necessarily be shaped to have a surface with irregularities as illustrated in FIGS. 25 to 27.

The above-mentioned configuration of the antenna module according to Embodiment 3 helps to reduce deviation of the characteristics of the antenna module from desired characteristics.

The embodiments herein disclosed are also expected to be practiced in combination with each other as appropriate insofar as no contradiction arises. The embodiments herein disclosed are to be considered as illustrative in all respects and not restrictive. The scope of the present disclosure is defined not by the above description but by the claims, and is intended to include all changes and modifications that fall within the meaning and scope of the claims and any equivalents thereof.

REFERENCE SIGNS LIST 31A, 31D, 33A, 33D, 37 switch
32AR, 32DR low-noise amplifier
32AT, 32DT power amplifier
34A, 34D attenuator
35A, 35D phase shifter
36 signal combiner/splitter
38 mixer
39 amplifier circuit
100, 100A to 100F, 100M, 100N, 200, 200A, 300, 900A antenna module
110 antenna array
120, 120A to 120F, 120M, 120N, 321, 322, 920 heat-dissipating component
130, 331, 332 dielectric substrate
140, 341, 342 ground electrode
170, 370 mold layer
260, 260A heat-dissipating electrode
280 bonding layer
323 heat sink
350 via conductor
380 fixing component
1000 communication device 1111 to 1114, 3111 to 3118 antenna element
190, 290, 391, 392 RFIC

The invention claimed is:

1. An antenna module comprising: a dielectric substrate; a first antenna element on the dielectric substrate; a first radio-frequency element that supplies electric power to the first antenna element; and a first heat-dissipating component that directs heat from the first radio-frequency element to an outside, wherein the dielectric substrate, the first radio-frequency element, and the first heat-dissipating component are stacked in this order in a direction normal to the dielectric substrate, wherein the first heat-dissipating component includes metal, and wherein when viewed in cross-section in a first direction orthogonal to the direction normal to the dielectric substrate, the first heat-dissipating component has a first width that differs from a second width, the first width being a width at a first position of the first heat-dissipating component, the second width being a width at a second position of the first heat-dissipating component, the second position being located away from the first position in the direction normal to the dielectric substrate, wherein the first heat-dissipating component has a first surface and a second surface, the first and second surfaces being orthogonal to the direction normal to the dielectric substrate, wherein a distance between the first radio-frequency element and the second surface is greater than a distance between the first radio-frequency element and the first surface, wherein the second surface includes the second position, and wherein the second width is less than the first width.

2. The antenna module according to claim 1, wherein when viewed in cross-section in a second direction orthogonal to the direction normal to the dielectric substrate and orthogonal to the first direction, the first heat-dissipating component has a third width that differs from a fourth width, the third width being a width at a third position of the first heat-dissipating component, the fourth width being a width at a fourth position of the first heat-dissipating component, the fourth position being located away from the third position in the direction normal to the dielectric substrate.

3. The antenna module according to claim 1, wherein when viewed in cross-section in the first direction, the first heat-dissipating component has a width, between the first position and the second surface, that decreases as a distance from the first surface increases.

4. The antenna module according to claim 3, wherein when viewed in cross-section in the first direction, the first heat-dissipating component has a width that is constant between the first surface and the first position.

5. The antenna module according to claim 3, wherein the first surface includes the first position.

6. The antenna module according to claim 3,
wherein the first heat-dissipating component has a lateral side that connects the first surface and the second surface, and
wherein when viewed in cross-section in the first direction, the lateral side comprises a straight line.

7. The antenna module according to claim 3,
wherein the first heat-dissipating component has a lateral side that connects the first surface and the second surface, and
wherein when viewed in cross-section in the first direction, the lateral side comprises a curved line.

8. The antenna module according to claim 7, wherein when viewed in cross-section in the first direction, the lateral side is bent to be convex in a direction toward the first radio-frequency element.

9. The antenna module according to claim 7, wherein when viewed in cross-section in the first direction, the lateral side is bent to be convex in a direction away from the first radio-frequency element.

10. The antenna module according to claim 1,
wherein the first radio-frequency element includes a heat-dissipating electrode exposed to a surface of the first radio-frequency element, and
wherein the first heat-dissipating component is fixed to the heat-dissipating electrode.

11. The antenna module according to claim 1, further comprising:
a second antenna element provided on the dielectric substrate;
a second radio-frequency element that supplies electric power to the second antenna element;
a second heat-dissipating component that directs heat from the second radio-frequency element to an outside; and
a third heat-dissipating component that directs heat from the first heat-dissipating component and heat from the second heat-dissipating component to an outside,
wherein the dielectric substrate, the second radio-frequency element, and the second heat-dissipating component are stacked in this order in the direction normal to the dielectric substrate,
wherein the second heat-dissipating component includes metal, and
wherein when viewed in cross-section in the first direction, the second heat-dissipating component has a fifth width that differs from a sixth width, the fifth width being a width at a fifth position of the second heat-dissipating component, the sixth width being a width at a sixth position of the second heat-dissipating component, the sixth position being located away from the fifth position in the direction normal to the dielectric substrate.

12. The antenna module according to claim 2,
wherein the first heat-dissipating component has a first surface and a second surface, the first and second surfaces being orthogonal to the direction normal to the dielectric substrate,
wherein a distance between the first radio-frequency element and the second surface is greater than a distance between the first radio-frequency element and the first surface,
wherein the second surface includes the second position, and
wherein the second width is less than the first width.

13. The antenna module according to claim 4,
wherein the first heat-dissipating component has a lateral side that connects the first surface and the second surface, and
wherein when viewed in cross-section in the first direction, the lateral side comprises a straight line.

14. The antenna module according to claim 5,
wherein the first heat-dissipating component has a lateral side that connects the first surface and the second surface, and
wherein when viewed in cross-section in the first direction, the lateral side comprises a straight line.

15. The antenna module according to claim 2,
wherein the first radio-frequency element includes a heat-dissipating electrode exposed to a surface of the first radio-frequency element, and
wherein the first heat-dissipating component is fixed to the heat-dissipating electrode.

16. The antenna module according to claim 1, wherein the first radio-frequency element includes a heat-dissipating electrode exposed to a surface of the first radio-frequency element, and wherein the first heat-dissipating component is fixed to the heat-dissipating electrode.

17. The antenna module according to claim 3,
wherein the first radio-frequency element includes a heat-dissipating electrode exposed to a surface of the first radio-frequency element, and
wherein the first heat-dissipating component is fixed to the heat-dissipating electrode.

18. The antenna module according to claim 4,
wherein the first radio-frequency element includes a heat-dissipating electrode exposed to a surface of the first radio-frequency element, and
wherein the first heat-dissipating component is fixed to the heat-dissipating electrode.

19. The antenna module according to claim 5,
wherein the first radio-frequency element includes a heat-dissipating electrode exposed to a surface of the first radio-frequency element, and
wherein the first heat-dissipating component is fixed to the heat-dissipating electrode.

\* \* \* \* \*